United States Patent
Oh et al.

(10) Patent No.: US 12,532,711 B2
(45) Date of Patent: Jan. 20, 2026

(54) MANUFACTURING METHOD OF SEMICONDUCTOR PACKAGE

(71) Applicant: SK hynix Inc., Icheon-si (KR)

(72) Inventors: Young Chan Oh, Icheon-si (KR); Hee Jong Kang, Icheon-si (KR); Young Mok Bae, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 583 days.

(21) Appl. No.: 17/979,316

(22) Filed: Nov. 2, 2022

(65) Prior Publication Data

US 2023/0411226 A1 Dec. 21, 2023

(30) Foreign Application Priority Data

May 31, 2022 (KR) .................. 10-2022-0066883

(51) Int. Cl.
| | | |
|---|---|---|
| G11C 16/04 | (2006.01) | |
| H01L 21/66 | (2006.01) | |
| H01L 21/77 | (2017.01) | |
| H01L 23/00 | (2006.01) | |

(52) U.S. Cl.
CPC ............. *H01L 22/14* (2013.01); *H01L 21/77* (2013.01); *H01L 24/43* (2013.01); *H01L 24/94* (2013.01)

(58) Field of Classification Search
CPC ......... H01L 22/14; H01L 21/77; H01L 24/43; H01L 24/91
See application file for complete search history.

(56) References Cited

U.S. PATENT DOCUMENTS

| | | | | |
|---|---|---|---|---|
| 7,461,535 B2 * | 12/2008 | Huang | ................... | G01P 21/00 374/2 |
| 7,512,507 B2 * | 3/2009 | Gatzemeier | .......... | G11C 29/006 702/117 |
| 11,568,949 B2 * | 1/2023 | Yu | .................. | G01R 31/318513 |

FOREIGN PATENT DOCUMENTS

| | | |
|---|---|---|
| KR | 1019970077074 A | 12/1997 |
| KR | 1020120095701 A | 8/2012 |
| KR | 1020200063564 A | 6/2020 |

OTHER PUBLICATIONS

Bong-Ju Jeong et al., Performance Analysis of Scheduling Rules in Semiconductor Wafer Fabrication, The Korea Society For Simulation, vol. 8, No. 3, pp. 49-66, Sep. 1999.

Daewoong An et al., A Yields Prediction in the Semiconductor Manufacturing Process Using Stepwise Support Vector Machine, IE Interfaces, vol. 22, No. 3, pp. 252-262, Sep. 2009.

(Continued)

*Primary Examiner* — Pho M Luu
(74) *Attorney, Agent, or Firm* — WILLIAM PARK AND ASSOCIATES LTD.

(57) ABSTRACT

A method of manufacturing a semiconductor package includes manufacturing dies on each of wafers, testing the wafers including the dies, calculating total scores for the wafers according to results of the tests, and setting reference values corresponding to semiconductor products. The method also includes classifying, as the semiconductor product, a selected wafer having a total score corresponding to a selected reference value among the reference values. The method further includes packaging the dies included in the selected wafer.

16 Claims, 13 Drawing Sheets

(56) References Cited

OTHER PUBLICATIONS

Patrick C. Deenan et al., Optimizing class-constrained wafer-to-order allocation in semiconductor back-end production, Journal of Manufacturing Systems vol. 57, pp. 72-81, Oct. 2020, Elsevier Ltd on behalf of The Society of Manufacturing Engineers.

Yoo Youngji Yoo et al., Wafer Map Image Analysis Methods in Semiconductor Manufacturing System, Journal of the Korean Institute of Industrial Engineers, vol. 41, No. 3, pp. 267-274, Jun. 2015, ISSN 1225-0988 | EISSN 2234-6457.

\* cited by examiner

[score table]

| WF# | OP | BB | DH | SM | FB | QWS | CNN | (TS) total score |
|---|---|---|---|---|---|---|---|---|
| 01 | 0 | 0 | 0 | 30 | 30 | 0 | 30 | 90 |
| 02 | 100 | 100 | 100 | 50 | 0 | 50 | 100 | 500 |
| 03 | 100 | 50 | 0 | 0 | 0 | 30 | 0 | 180 |
| 04 | 0 | 0 | 0 | 0 | 0 | 0 | 0 | 0 |
| 05 | 100 | 100 | 100 | 100 | 100 | 100 | 100 | 700 |

MANUFACTURING METHOD OF SEMICONDUCTOR PACKAGE

CROSS-REFERENCE TO RELATED APPLICATION

The present application claims priority under 35 U.S.C. § 119(a) to Korean patent application number 10-2022-0066883 filed on May 31, 2022, in the Korean Intellectual Property Office, the entire disclosure of which is incorporated by reference herein.

BACKGROUND

1. Technical Field

The present disclosure generally relates to a manufacturing method of a semiconductor package, and more particularly, to a manufacturing method of a semiconductor package, in which dies are classified for each semiconductor product, and the classified dies are packaged.

2. Related Art

A semiconductor package may include a plurality of dies configured to store data. The plurality of dies may be simultaneously manufactured on one wafer. Dies manufactured on the same wafer should have the same electrical characteristics regardless of positions of the dies on the wafer, but may have different electrical characteristics due to physical or chemical limitations in a manufacturing process. In addition, although dies are manufactured on the same wafer through the same manufacturing process, some dies may have a defect where the dies cannot be used as products. These defective dies may be detected in a test phase to be excluded from packaging targets. The other normal dies except the defective dies may be packaged in an order in which the normal dies are manufactured, to be produced as a semiconductor package.

As the types of electronic devices using semiconductor packages rapidly increase, various performance standards for the semiconductor packages are required.

SUMMARY

Various embodiments provide a manufacturing method of a semiconductor package, in which dies can be packaged according to performance required in a semiconductor product.

In accordance with an aspect of the present disclosure, a method of manufacturing a semiconductor package includes: manufacturing dies on each of wafers; testing the wafers including the dies; calculating total scores for the wafers according to results of the testing; setting reference values corresponding to semiconductor products; classifying, as the semiconductor product, a selected wafer having a total score corresponding to a selected reference value among the reference values; and packaging the dies included in the selected wafer.

In accordance with another aspect of the present disclosure, a method of manufacturing a semiconductor package includes: manufacturing dies on a wafer; performing test operations on the dies; calculating scores for the dies according to results of the test operations; setting a reference range corresponding to a semiconductor product; classifying, as the semiconductor product, selected dies having a score included in the reference range; and packaging the selected dies.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be enabling to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

The specific structural and functional descriptions disclosed herein are merely illustrative for the purpose of describing embodiments according to the concept of the present disclosure. Additional embodiments according to the concept of the present disclosure can be implemented in various forms. Thus, the present disclosure should not be construed as being limited to the embodiments set forth herein.

Hereinafter, it will be understood that, although the terms "first," "second," "third," etc. may be used herein to describe various elements, these elements should not be limited by these terms. These terms are only used to distinguish one element from another element and are not used to imply a number or order of elements.

Figure 1:
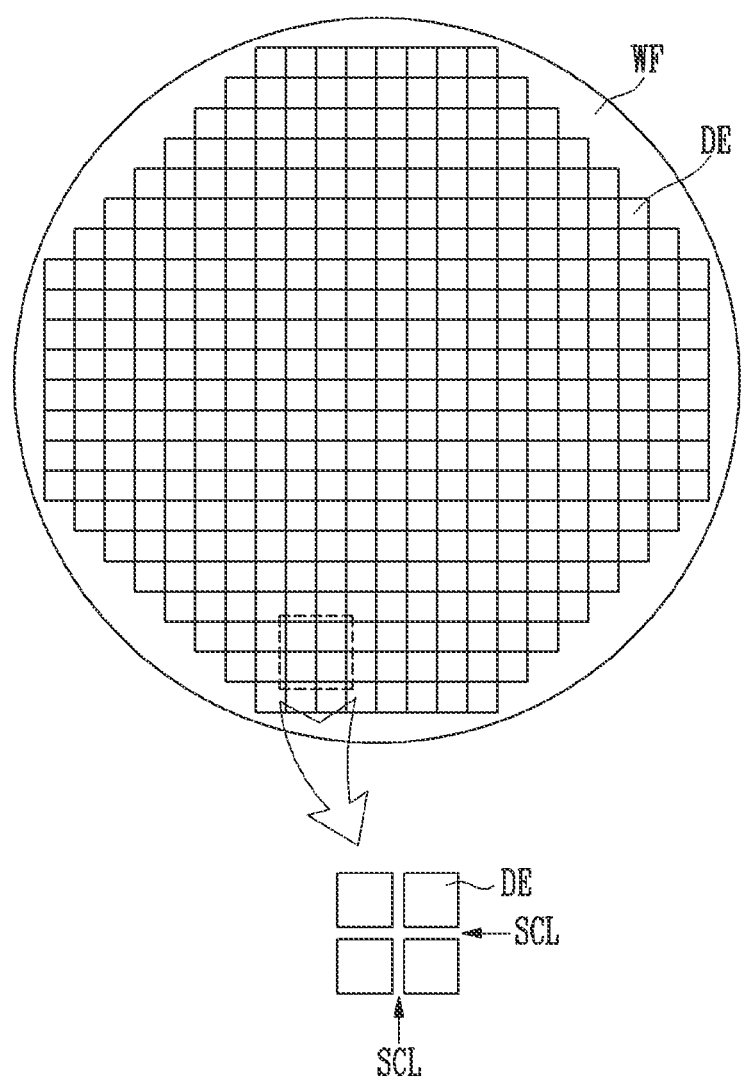
FIG. 1 is a diagram illustrating a wafer used for a semiconductor package.

FIG. 1 is a diagram illustrating a wafer used for a semiconductor package.

Referring to FIG. 1, a wafer WF is a substrate on which dies DE can be formed. The wafer WF is a circular substrate obtained by cutting, to a thin thickness, a single crystalline ingot obtained by growing silicon (Si) or gallium arsenide (GaAs). A plurality of dies DE may be formed on the wafer WF, and each of the dies DE may be manufactured as a memory chip capable of storing data through a semiconductor manufacturing process.

The dies DE formed on the wafer WF may be spaced apart from each other by using scribe lanes SCL as boundaries. After the dies DE are manufactured on the wafer WF, the dies DE may be cut along the scribe lanes SCL for the purpose of packaging.

The dies DE may be manufactured as various types of memory devices, and dies DE manufactured on the same wafer WF may be manufactured as the same kind of memory device. For example, a memory device may be classified as a volatile memory device in which stored data disappears when the supply of power is interrupted or a nonvolatile memory device in which stored data is retained even when the supply of power is interrupted. A volatile memory device may include random access memory (RAM), and the RAM may be classified as dynamic random access memory (DRAM), static random access memory (SRAM), and the like. A nonvolatile memory device may include NAND flash memory, NOR flash memory, resistive random access memory (ReRAM), phase-change random access memory (PRAM), magnetoresistive random access memory (MRAM), ferroelectric random access memory (FRAM), spin transfer torque random access memory (STT-RAM), and the like. A die DE manufactured as a nonvolatile memory device will be described below as an example.

Figure 2:
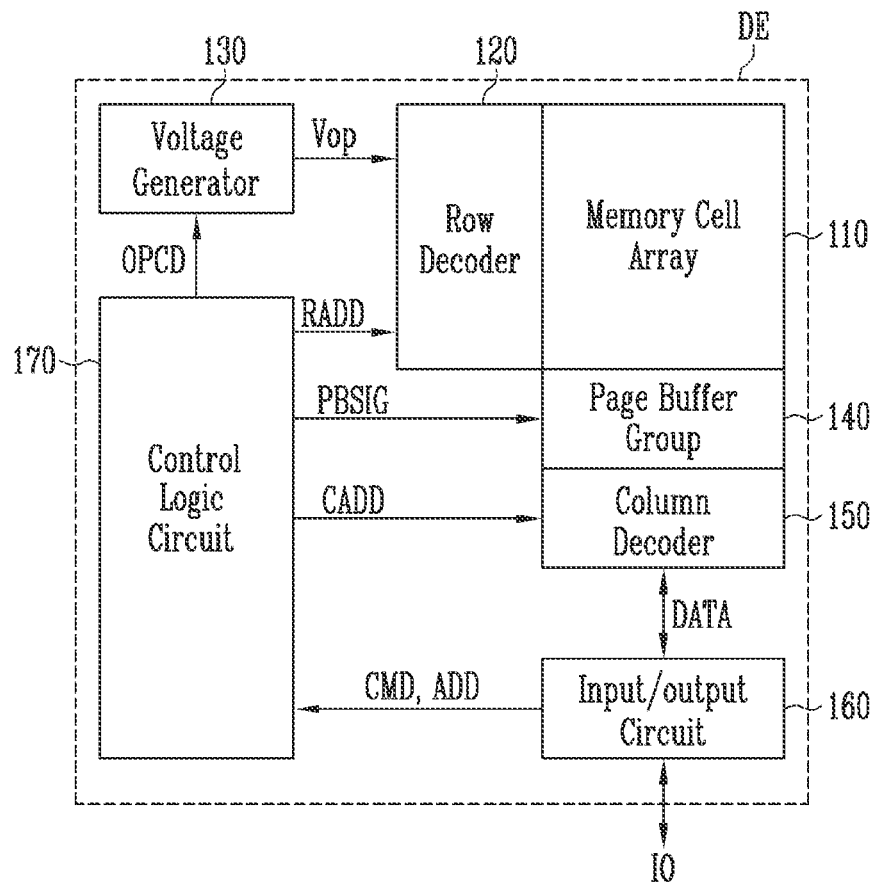
FIG. 2 is a diagram illustrating a configuration of a die.

FIG. 2 is a diagram illustrating a configuration of a die.

Referring to FIG. 2, the die DE manufactured as a nonvolatile memory device may include a memory cell array 110 in which data is stored and peripheral circuits 120 to 170 capable of performing a program operation, a read operation, or an erase operation.

The memory cell array 110 may include a plurality of memory blocks in which data is stored. Each of the memory blocks may include memory blocks, and the memory cells may be implemented in a two-dimensional structure in which the memory cells are arranged in a direction parallel to a substrate, or be implemented in a three-dimensional structure in which the memory cells are stacked in a vertical direction above a substrate.

The peripheral circuits 120 to 170 may include a row decoder 120, a voltage generator 130, a page buffer group 140, a column decoder 150, an input/output circuit 160, and a control logic circuit 170.

The row decoder 120 may select one memory block among the memory blocks included in the memory cell array 110 according to a row address RADD, and transmit operating voltages Vop to the selected memory block.

The voltage generator 130 may generate and output the operating voltages Vop necessary for various operations in response to an operation code OPCD. For example, the voltage generator 130 may generate a program voltage, a read voltage, an erase voltage, a pass voltage, a turn-on voltage, a ground voltage, and the like in response to the operation code OPCD, and selectively output the generated voltages.

The page buffer group 140 may be connected to the memory cell array 110 through bit lines. For example, the page buffer group 140 may include page buffers connected to the respective bit lines. The page buffers may simultaneously operate in response to page buffer control signals PBSIG, and temporarily store data in a program, read, or verify operation. The page buffers may sense a current of the bit lines, which varies according to threshold voltages of the memory cells, in a read or verify operation.

The column decoder 150 may transmit data DATA between the input/output circuit 160 and the page buffer group 140 according to a column address CADD.

The input/output circuit 160 may be connected to an external device through input/output lines IO. For example, the external device may be a controller capable of transmitting a command CMD, an address ADD, or data DATA to the die DE. The input/output circuit 160 may input/output a command CMD, an address ADD, and data DATA through the input/output lines IO. For example, the input/output circuit 160 may transmit the command CMD and the address ADD, which are received from the external device, to the control logic circuit 170 through the input/output lines IO, and transmit the data DATA received from the external device to the column decoder 150 through the input/output lines IO. The input/output circuit 160 may output the data DATA received from the column decoder 150 to the external device through the input/output lines IO.

The control logic circuit 170 output the operation code OPCD, the row address RADD, the page buffer control signals PBSIG, and the column address CADD in response to the command CMD and the address ADD. For example, the control logic circuit 170 may include software for performing an algorithm in response to the command CMD and hardware for outputting the address ADD and various control signals.

Figure 3:
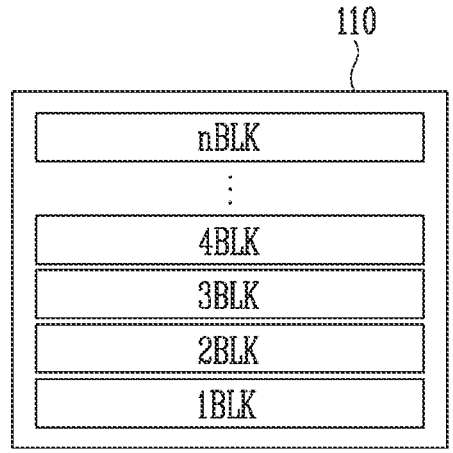
FIG. 3 is a diagram illustrating a memory cell array included in the die.

FIG. 3 is a diagram illustrating the memory cell array included in the die.

Referring to FIG. 3, the memory cell array 110 may include first to nth memory blocks 1BLK to nBLK. A program, read, or erase operation may be performed in a selected memory block among the first to nth memory blocks 1BLK to nBLK. Because each of the first to nth memory blocks 1BLK to nBLK includes a plurality of memory cells, electrical characteristics of the first to nth memory blocks 1BLK to nBLK may be different from each other according to an electrical characteristic of memory cells included in the memory block. For example, each of the first to nth memory blocks 1BLK to nBLK may become a fast block or a slow block according to an operation speed of memory cells included therein. A fast block means a memory block having a relatively short time taken in the program, read, or erase operation as compared with other memory blocks, and a slow block means a memory block having a relatively long time taken in the program, read, or erase operation as compared with other memory blocks. In addition, during a manufacturing process of the memory device, a memory block including defective cells may be specified as a bad block. Access of the memory block specified as the bad block may be blocked not to be used even after the memory device is completely manufactured. Therefore, in a test phase performed after the memory device is manufactured, the grade of the memory device varies according to a number of bad blocks.

Figure 4:
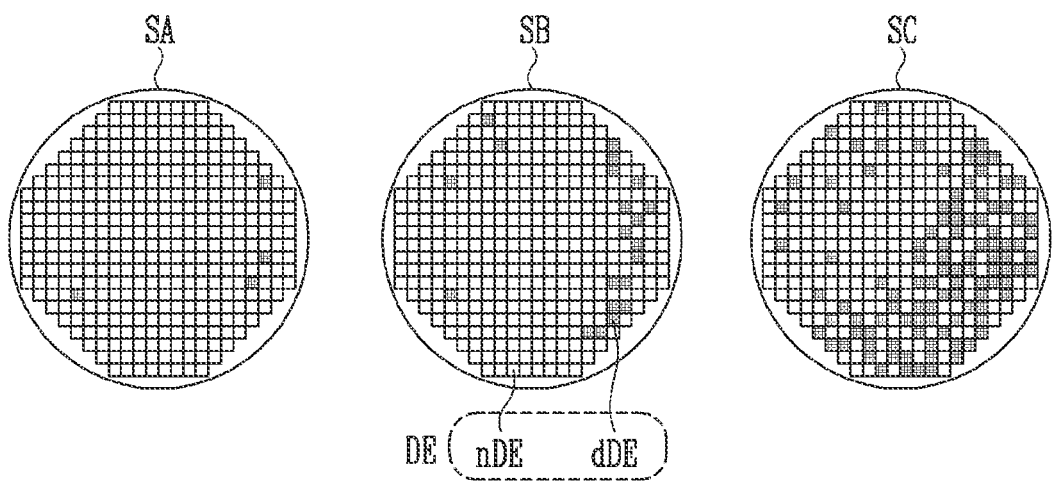
FIG. 4 is a diagram illustrating a defect distribution of dies manufactured on a wafer.

FIG. 4 is a diagram illustrating a defect distribution of dies manufactured on a wafer.

Referring to FIG. 4, although dies DE are manufactured on a wafer through the same manufacturing process, defective dies dDE may occur due to various physical, chemical, or electrical differences which may occur in the manufacturing process. For example, when dies are manufactured on a wafer, each die may be classified as a normal die nDE or a defective die dDE through a test operation. A defective die dDE may be a die of which electrical characteristic is lower than a reference electrical characteristic of a test operation. A defective die dDE may be detected by various test methods, and a distribution of defective dies dDE may vary according to a test method. For example, the grade of a wafer may be determined according to a number of defective dies included in the wafer. A wafer in which a number of defective die dDE is smaller than a reference number may have a grade SA which is best, a wafer in which a number of defective dies dDE is within an interval of the reference number may have a grade SB which is a middle grade, and a wafer in which a number of defective dies dDE is greater than the reference number may have a grade SC which is worst.

Normal dies nDE may exist even in a wafer having a bad grade, and these dies may be available. However, a normal die nDE manufactured on a wafer having the bad grade may have an electrical characteristic worse than an electrical characteristic of a normal die nDE manufactured on a wafer having a relatively high grade. Therefore, in this embodiment, wafers may be tested by various methods, a score may be given to a wafer or each of dies included in the wafer according to a test result, and the dies may be packaged as semiconductor products corresponding to the scores.

Figure 5:
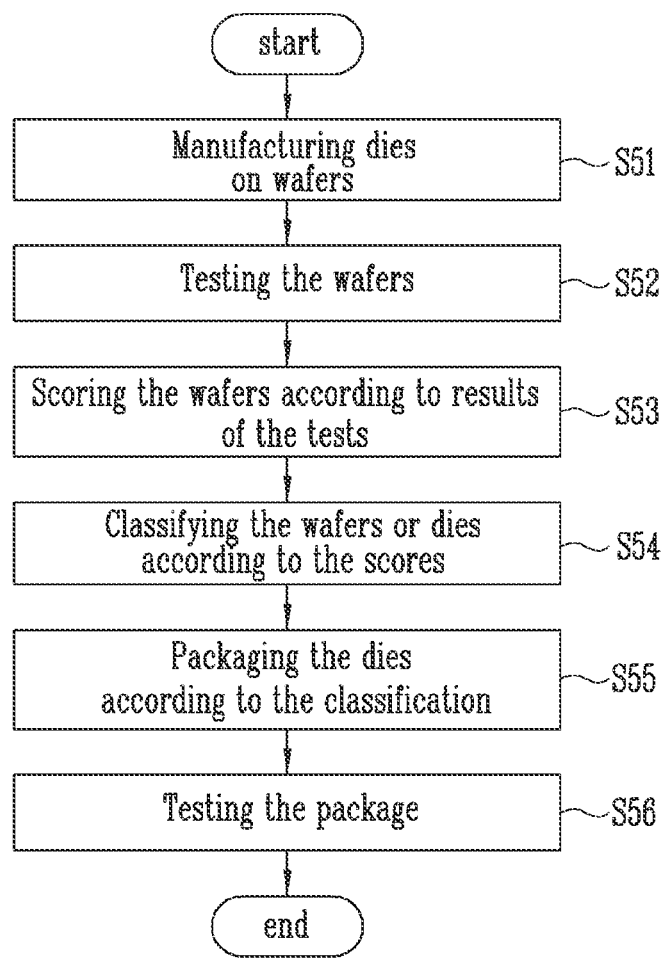
FIG. 5 is a flowchart illustrating a manufacturing method of a semiconductor package in accordance with the present disclosure.

FIG. 5 is a flowchart illustrating a manufacturing method of a semiconductor package in accordance with the present disclosure.

Referring to FIG. 5, when dies are manufactured on wafers (S51), step S52 of testing wafers may be performed. The test step S52 may be performed on all the dies manufactured on the wafers by using various methods. Various test methods will be described with reference to FIG. 6.

A score may be given to each of the wafers according to results of the test step S52 (S53). For example, a score may be given in a wafer or die unit to each of various tests performed in the step S52. A method of giving scores will be described with reference to FIG. 7.

Subsequently, step S54 of classifying wafers or dies according to the scores may be performed. For example, wafers or dies may be classified based on the scores, according to characteristics or required conditions of semiconductor packages in which dies are to be mounted or semiconductor devices in which semiconductor packages are to be mounted. For example, dies having a high score may be classified as dies to be mounted in a semiconductor device which requires high reliability, and dies having a low score may be classified as dies to be mounted in a semiconductor device which requires low reliability. That is, wafers or dies, which have characteristics similar to each other, may be classified.

Because the classified dies have characteristics similar to each other, the classified dies may be packaged as the same package (S55). Semiconductor packages packaged in the step S55 may be mounted in a semiconductor product corresponding to the score of the dies through testing (S56).

Figures 6, 7:
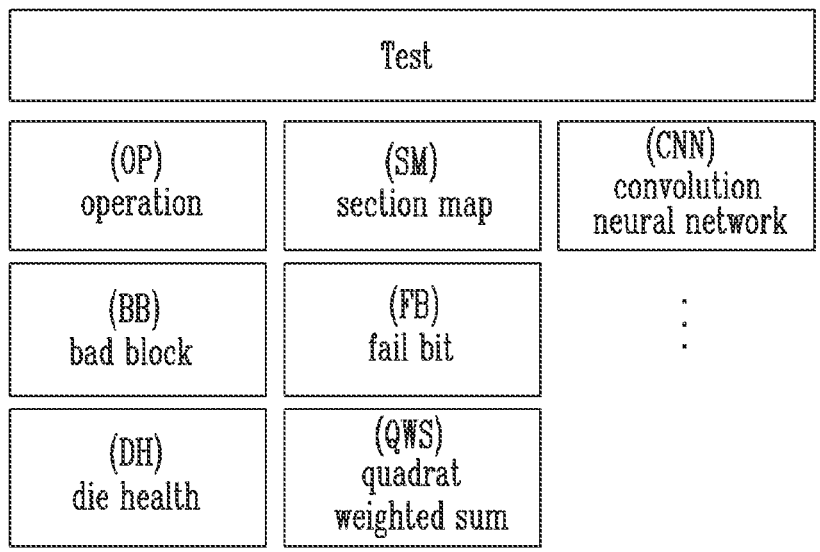
FIG. 6 is a diagram illustrating a test method in accordance with the present disclosure.
FIG. 7 is a diagram illustrating a score table in accordance with the present disclosure.

FIG. 6 is a diagram illustrating a test method in accordance with the present disclosure.

Referring to FIG. 6, the test method may be performed in various manners according to a test purpose. For example, the test method may include an operation (OP) test, a bad block (BB) test, a die health (DH) test, a section map (SM) test, a fail bit (FB) test, a quadrat weighted sum (QWS) test, a convolution neural network (CNN) test, and the like.

The OP test may perform a test program operation, a test read operation, or a test erase operation on dies, and check whether a result of the performed test operation is normal. The BB test may check a number of bad blocks detected in the test program operation, the test read operation, or the test erase operation, which is performed in the OP test. The DH test may check abrasion evaluation according to a number of times program and erase operations are performed, an iteration number of an error correction operation, a threshold voltage distribution variation of memory cells, or the like. The SM test may divide a wafer into various sections, and check a physical defect or an electrical defect of dies for each section. The FB test may check a region in which fail bits occur, and count a number of fail bits. The QWS test is one of spatial pattern analysis methods of analyzing a pattern of observed values scattered on a wafer. Quadrat means a detailed region obtained by partitioning the whole region of a test target in a regular lattice form. Therefore, occurrence positions and a density of fail bits detected in each of detailed regions may be calculated in the QWS test. The CNN test is a kind of deep learning technique. The CNN test may perform a multiplication operation on test values measured in detailed regions of a wafer and a filter, and check a convolution feature by adding up the calculated values. In addition, various types of tests may be performed.

FIG. 7 is a diagram illustrating a score table in accordance with the present disclosure.

Referring to FIGS. 7 and 6, the score table may include scores representing results of various tests described with reference to FIG. 6 for each wafer, and include a total score TS obtained by adding up scores of each of the wafers. A score may be numerically represented within a reference range. For example, a range of the score may be described according to a test number. For example, when assuming that 7 tests are performed and a maximum score of each test is 100, the range of a total score TS may be set to 0 to 700. As a score becomes close to 0 in each test, this means bad quality. As a score becomes close to 100 in each test, this means good quality. Therefore, a best score among total scores TS may become 700 obtained by adding up all scores of the 7 tests.

Scores of a first wafer WF01 will be described below as an example.

Each of scores of the OP test, the BB test, the DH test, and the QWS test is 0, and each of scores of the SM test, the FB test, and the CNN test is 30. Therefore, a total score TS of the first wafer WF01 is 90. The range of the total score TS is 0 to 700, and hence it may be determined that the quality of the first wafer WF01 is very bad.

Scores of a fifth wafer WF05 will be described below as an example.

Each of scores of the OP test, the BB test, the DH test, the SM test, the FB test, the QWS test, and the CNN test is 100. Therefore, a total score TS of the fifth wafer WF05 is 700. The range of the total score TS is 0 to 700, and hence it may be determined that the quality of the fifth wafer WF05 is very good.

Values of the score table may become a reference when wafers are classified for each semiconductor product.

Figure 8:
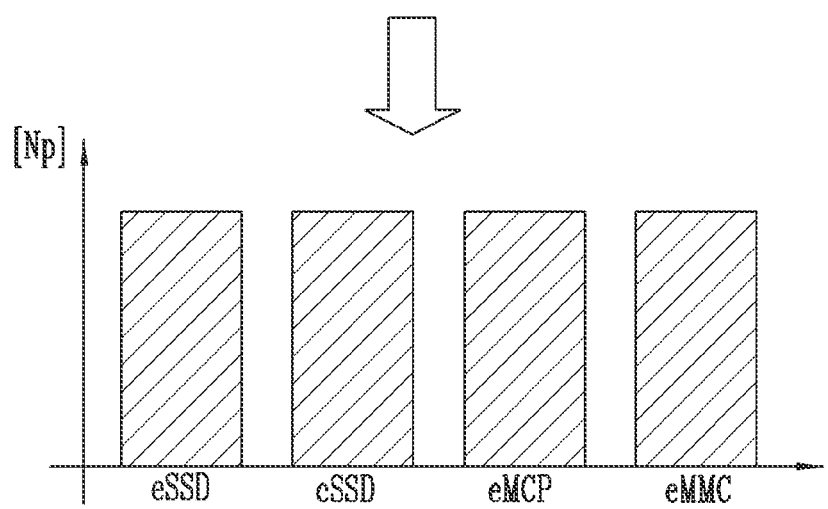
FIG. 8 is a diagram illustrating a production schedule of semiconductor products.

FIG. 8 is a diagram illustrating a production schedule of semiconductor products.

Referring to FIG. 8, the production schedule represents a reference value of a total score TS varying according to a production amount or a quality of each of semiconductor products. An eSSD is a semiconductor product for servers, and is a product which requires high performance, reliability, and durability, as compared with a cSSD. The cSSD is a semiconductor product used for notebook or mobile products, and is a product which requires high performance, reliability, and durability, as compared with an eMCP. The eMCP is a semiconductor product used for mobile products by packaging DRAM and NAND flash together, and is product which requires high performance, reliability, and durability, as compared with an eMMC. The eMMC is a semiconductor product mainly used for mobile products, and may be used as a semiconductor product coupled to a controller having a multimedia card interface.

The semiconductor products eSSD, cSSD, eMCP, and eMMC have different performances, reliabilities, and durabilities, which are required according to uses thereof, differences between prices of the semiconductor products occur due to these differences. Production amounts of semiconductor products may vary according to requirements of markets. Therefore, in this embodiment, a classification system may be provided, which can increase a yield while rapidly and easily coping with such a change.

A first production schedule $1^{st}$ PS may be a schedule for increasing a production amount of the eSSD as a semiconductor product. When a total score TS is set to 0 to 700, in the first production schedule $1^{st}$ PS, a reference value of the eSSD is set to 301 to 700, and a reference value of each of the other cSSD, eMCP, and eMMC is set to 0 to 300. Therefore, the range of a reference value allocated to the eSSD in the entire total score TS is relatively large. Because a number of wafers included in the range of a reference value increases as the range of the corresponding reference value increases, wafers can be classified by adjusting the range of the reference value according to a production plan. Therefore, in a phase of classifying wafers, wafers of which total score TS corresponds to 301 to 700 may be classified as wafers for the eSSD, and the other wafers of which total score TS corresponds to 0 to 300 may be classified as wafers for the cSSD, the eMCP, or the eMMC. Dies of the wafers classified as dies for the eSSD may be packaged as a package for the eSSD to be mounted in an eSSD product. According to the first production schedule $1^{st}$ PS, wafers of which total score TS correspond to 101 to 300 among the other wafers of which total score TS corresponds to 0 to 300 may be classified as wafers for the cSSD, wafers of which total score TS corresponds to 51 to 100 among the other wafers of which total score TS corresponds to 0 to 300 may be classified as wafers for the eMCP, and wafers of which total score TS corresponds to 0 to 50 among the other wafers of which total score TS corresponds to 0 to 300 may be classified as wafers for the eMMC.

A second production schedule $2^{nd}$ PS may be a schedule for increasing production amounts of the eMCP and the eMMC. In the second production schedule $2^{nd}$ PS, a reference value of the eSSD is set to 650 to 700, and hence a production amount of the eSSD is smaller than the production amount of the eSSD in the first production schedule $1^{st}$ PS. In the second production schedule $2^{nd}$ PS, a reference value of each of the eMCP and the eMMC is set to 0 to 300, and hence a range of a reference value allocated to each of the eMCP and the eMMC is wider than the range in the first production schedule $1^{st}$ PS. Therefore, in a phase of classifying wafers, wafers of which total score TS corresponds to 0 to 600 may be classified as wafers for the eMCP or the eMMC. The other wafers of which total score TS corresponds to 601 to 700 may be classified as wafers for the eSSD or the cSSD. Dies of the wafers classified as dies for the eMCP or the eMMC may be packaged as a package for the eMCP or the eMMC to be mounted in an eMCP or eMMC product.

A third production schedule $3^{rd}$ PS may be a schedule for classifying high-quality wafers or dies. For example, in order to classify wafers corresponding to a maximum value of a total score TS, the reference value of the eSSD may be set to 700. In this schedule, wafers or dies, which are manufactured with a highest quality, may be classified, and the reference values of the other cSSD, the eMCP, and the eMMC may be set within 0 to 699 according to a production plan.

Thus, when the production schedule is adjusted, production amounts Np of various products (eSSD, cSSD, eMCP, eMMC, and the like) can be uniformly adjusted, so that a production amount of a specific product can be prevented from being excessively increased.

Figure 9:
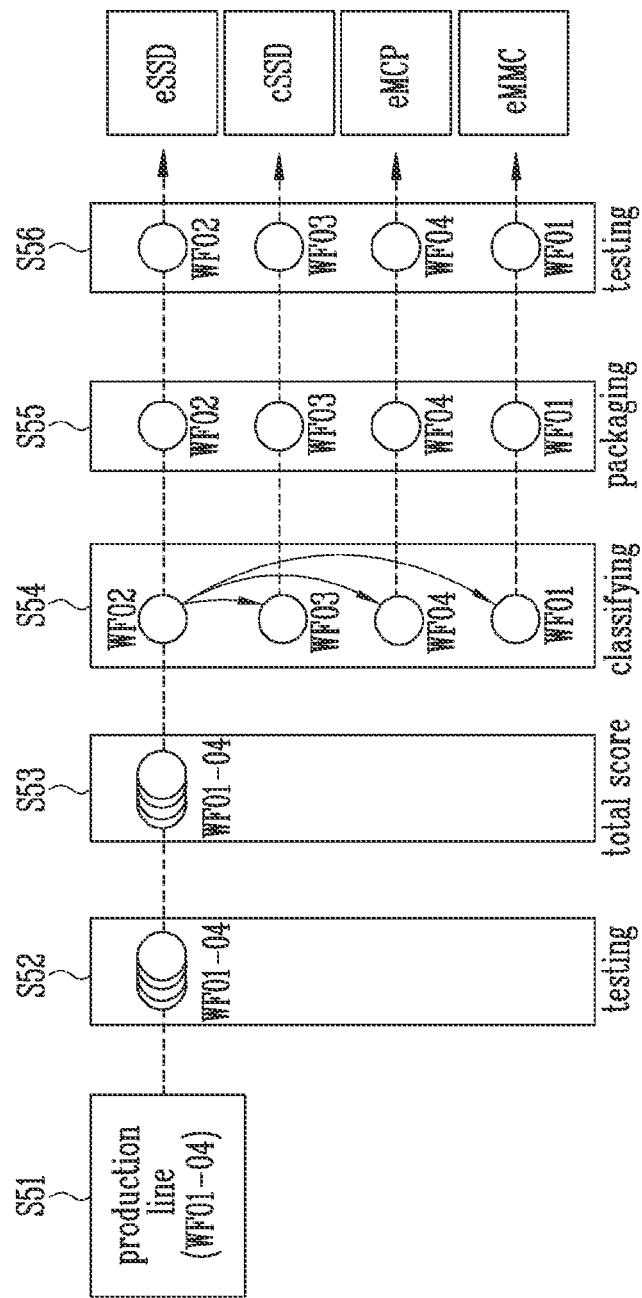
FIG. 9 is a diagram illustrating a manufacturing method of a semiconductor package in accordance with a first embodiment of the present disclosure.

FIG. 9 is a diagram illustrating a manufacturing method of a semiconductor package in accordance with a first embodiment of the present disclosure.

Referring to FIGS. 9 and 5, on a production line, dies may be manufactured on wafers (S51). For example, dies may be simultaneously manufactured on first to fourth wafers WF01 to WF04. When the dies are manufactured on the first to fourth wafers WF01 to WF04, the test step S52 of the first to fourth wafers WF01 to WF04 may be performed. In the test step, the first to fourth wafers WF01 to WF04 may be sequentially tested or be simultaneously tested. According to results of the test performed in the step S52, total scores of the first to fourth wafers WF01 to WF04 may be calculated (S53).

According to the total scores calculated in the step S53, each of the first to fourth wafers WF01 to WF04 may be classified as a wafer for the eSSD, the cSSD, the eMCP, or the eMMC (S54). For example, each of the first to fourth wafers WF01 to WF04 may be classified as a wafer for the eSSD, the cSSD, the eMCP, or the eMMC by comparing each of the total scores calculated in the step S53 with reference values corresponding to the eSSD, the cSSD, the eMCP, and the eMMC. For example, when a total score of the first wafer WF01 is included in the reference value of the eMMC, the first wafer WF01 may be classified as a wafer for the eMMC. When a total score of the second wafer WF02 is included in the reference value of the eSSD, the second wafer WF02 may be classified as a wafer for the eSSD. When a total score of the third wafer WF03 is included in the reference value of the cSSD, the third wafer WF03 may be classified as a wafer for the cSSD. When a total score of the fourth wafer WF04 is included in the reference value of the eMCP, the fourth wafer WF04 may be classified as a wafer for the eMCP.

The first to fourth wafers WF01 to WF04 classified in the step S54 may be packaged according to uses thereof to be manufactured as semiconductor packages (S55), and a test step of the semiconductor packages may be performed (S56). In the test step S56, each of semiconductor packages having a normal grade may be used for a memory device of the eSSD, the cSSD, the eMCP, or the eMMC.

Figure 10:
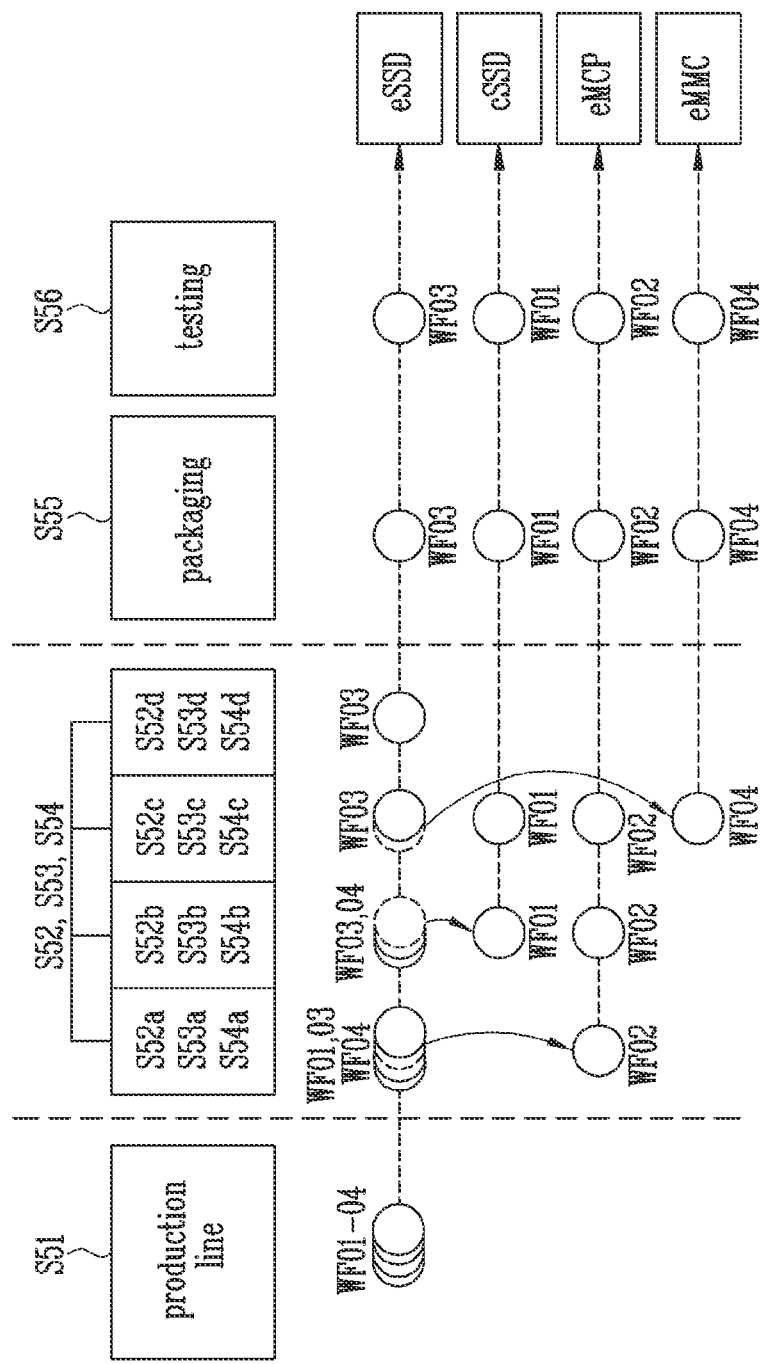
FIG. 10 is a diagram illustrating a manufacturing method of a semiconductor package in accordance with a second embodiment of the present disclosure.

FIG. 10 is a diagram illustrating a manufacturing method of a semiconductor package in accordance with a second embodiment of the present disclosure.

Referring to FIGS. 10 and 5, on a production line, dies may be manufactured on wafers (S51). For example, dies may be simultaneously manufactured on first to fourth wafers WF01 to WF04. When the dies are manufactured on the first to fourth wafers WF01 to WF04, the test step S52, the total score calculation step S53, and the classification step S54 of the first to fourth wafers WF01 to WF04 may be performed. That is, the total score calculation step S53 and the classification step S54 may be consecutively performed according to a kind of test performed in the test step S52. For example, first test step S52a using a first test manner may be a test step for classifying the eMCP. Therefore, when the first test step S52a is performed, a score according to a result of the first test step S52a may be calculated (S53a), and the second wafer WF02 having a score corresponding to the reference value of the eMCP may be classified as a wafer for the eMCP.

Because the second wafer WF02 among the first to fourth wafers WF01 to WF04 is classified as a wafer for the eMCP, second test step S52b using a second test manner may be performed on the first, third, and fourth wafers WF01, WF03, and WF04. For example, the second test step S52b using the second test manner may be a test step for classifying the cSSD. Therefore, when the second test step S52b is performed, a score according to a result of the second test step S52b may be calculated (S53b), and the first wafer WF01 having a score corresponding to the reference value of the cSSD may be classified as a wafer for the cSSD (S54b).

Because the first wafer WF01 among the first, third, and fourth wafers WF01, WF03, and WF04 is classified as a wafer for the cSSD, third test step S52c using a third test manner may be performed on the third and fourth wafers WF03 and WF04. For example, the third test step S52c using the third test manner may be a test step for classifying the eMMC. Therefore, a score according to a result of the third test step S52c may be calculated (S53c), and the fourth wafer WF04 having a score corresponding to the reference value of the eMMC may be classified as a wafer for the eMMC (S54c).

Because the fourth wafer WF04 among the third and fourth wafers WF03 and WF04 is classified as a wafer for the eMMC, fourth test step S52d using a fourth test manner may be performed on the fourth wafer WF04. For example, the fourth test step S52d using the fourth test manner may be a test step for classifying the eSSD. Therefore, a score according to a result of the fourth test step S52d may be calculated (S53d), and the third wafer WF03 having a score corresponding to the reference value of the eSSD may be classified as a wafer for the eSSD.

The first to fourth wafers WF01 to WF04 classified in the steps S54a to S54d may be packaged according to uses thereof to be manufactured as semiconductor packages (S55), and a test step of the semiconductor packages may be performed (S56). In the test step S56, each of semiconductor packages having a normal grade may be used for a memory device of the eSSD, the cSSD, the eMCP, or the eMMC.

Figure 11:
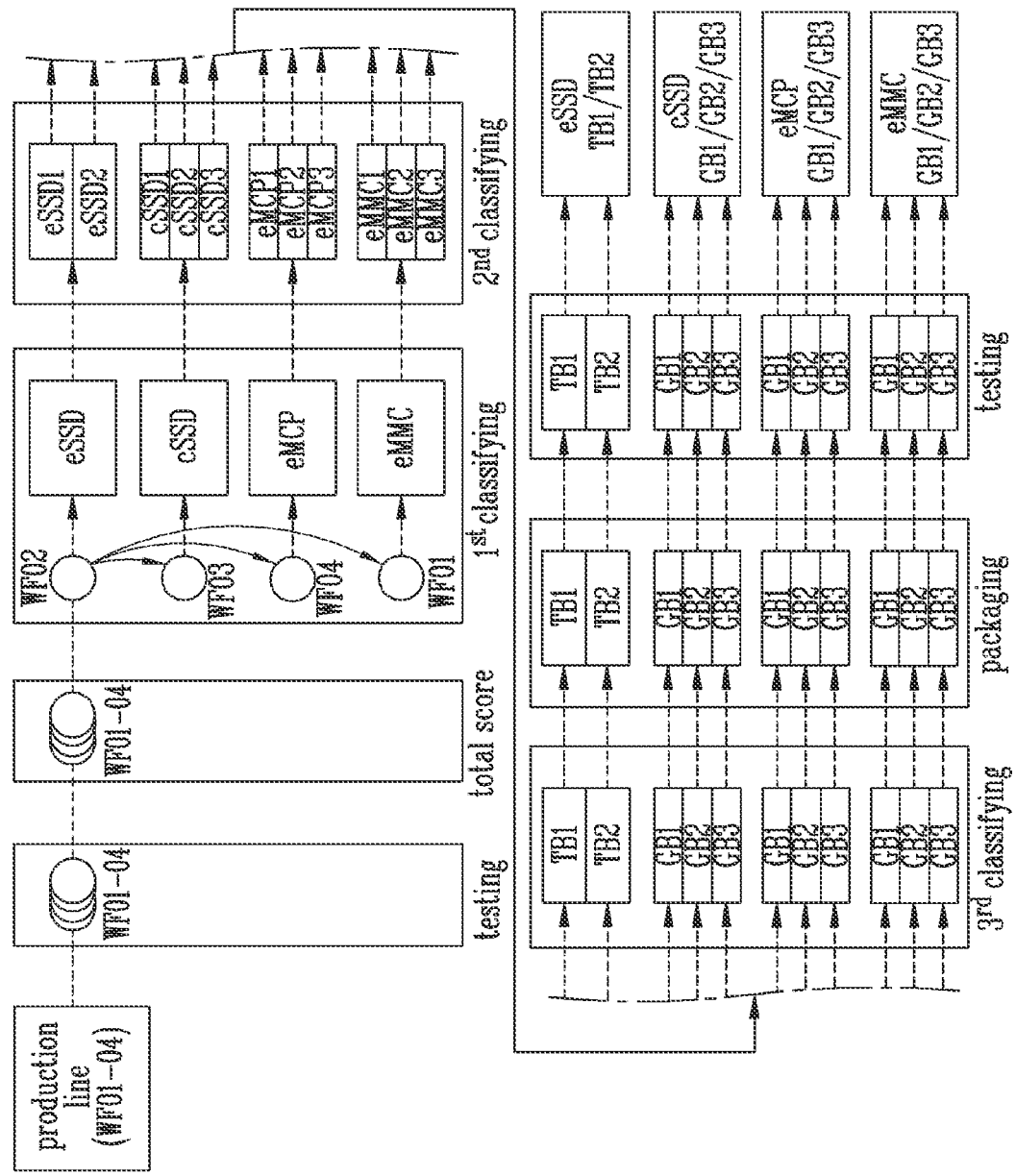
FIG. 11 is a diagram illustrating a manufacturing method of a semiconductor package in accordance with a third embodiment of the present disclosure.

FIG. 11 is a diagram illustrating a manufacturing method of a semiconductor package in accordance with a third embodiment of the present disclosure.

Referring to FIG. 11, on a production line, dies may be manufactured on wafers. For example, dies may be simultaneously manufactured on first to fourth wafers WF01 to WF04. When the dies are manufactured on the first to fourth wafers WF01 to WF04, a test step (testing) and a total score calculation step (total score) may be performed. When a total score is calculated, a first classification step ($1^{st}$ classifying) may be performed according to the total score. In the first classification step ($1^{st}$ classifying), the first to fourth wafers WF01 to WF04 may be classified as a first product group according to the total score. The first product group may be a kind of semiconductor product. For example, the first product group may include an eSSD, a cSSD, an eMCP, an eMMC, and the like. For example, according to the total score, the first wafer WF01 may be classified as a wafer for the eMMC, the second wafer WF02 may be classified as a wafer for the eSSD, the third wafer WF03 may be classified as a wafer for the eMCP, and the fourth wafer WF04 may be classified as a wafer for the eMCP.

When the first to fourth wafers WF01 to WF04 are classified as the first product group, a second classification step ($2^{nd}$ classifying) may be performed according to a score of each of the tests, which is stored in the score table described with reference to FIG. 7. The first to fourth wafers WF01 to WF04 may be re-classified as a second product group more elaborate than the first product group. The second product group means products subdivided into more elaborate kinds. For example, the eSSD, the cSSD, the eMCP, and the eMMC, which are classified as the first product group, may be classified into an eSSD1, an eSSD2, a cSSD1, a cSSD2, a cSSD3, an eMCP1, an eMCP2, an eMCP3, an eMMC1, an eMMC2, an eMMC3, and the like according to reliability, use, and the like.

Wafers classified as the second product group in the second classification step ($2^{nd}$ classifying) may be re-classified according to a storage capacity in the second classification step ($2^{nd}$ classifying). For example, the wafers may be re-classified into a first terabyte TB1, a second terabyte TB2, a first gigabyte GB1, a second gigabyte GB2, a third gigabyte GB3, and the like. The terms 'first,' 'second,' 'third,' and the like do not mean sizes of the storage capacity but indicate different storage capacities. In the embodiment described with reference to FIG. 11, produced wafers are classified according to a total score, a product group, and a storage capacity. However, in addition, classification steps of classifying wafers according to various conditions may be performed.

When wafers are classified by a third classification step ($3^{rd}$ classifying), dies of finally classified wafers may be packaged (packaging) for each product to be manufactured as semiconductor packages, and a test step (testing) of the semiconductor packages may be performed. Semiconductor packages having a normal grade in the test step may be used for a memory device of the eSSD, the cSSD, the eMCP, or the eMMC.

Figure 12:
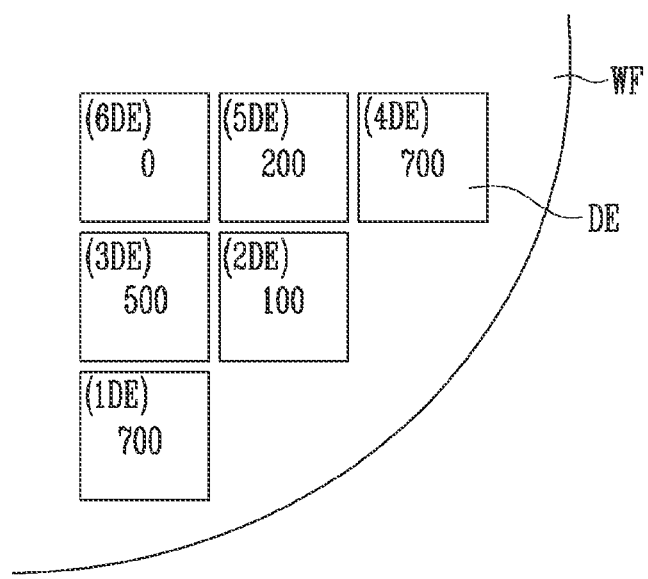
FIG. 12 is a diagram illustrating dies manufactured on a wafer.

FIG. 12 is a diagram illustrating dies manufactured on a wafer.

Referring to FIG. 12, a plurality of dies DE may be manufactured on a wafer WF, and total scores of the dies DE may be different from one another. For example, when a total score of a first die 1DE is 700, a total score of a second die 2DE may be 100. When comparing first and second dies 1DE and 2DE with each other, the first and second dies 1DE and 2DE may have different total scores even though the first and second dies 1DE and 2DE are manufactured on the same wafer WF. Because the total score of the first die 1DE is higher than the total score of the second die 2DE, it may be determined that the first die 1DE has high performance, reliability, and durability as compared with the second die 2DE. Therefore, dies DE manufactured on the same wafer WF may be classified before a package step, according to total scores of the dies DE.

Figure 13:
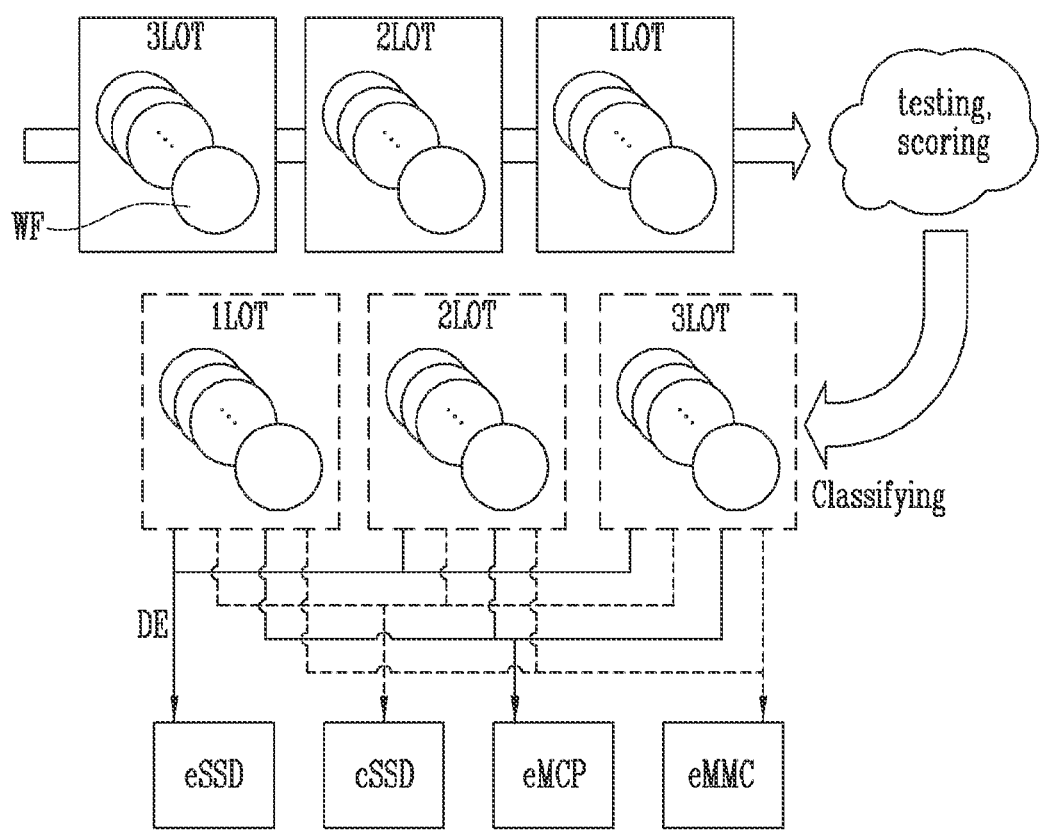
FIGS. 13 and 14 are views illustrating a manufacturing method of a semiconductor package in accordance with a fourth embodiment of the present disclosure.
Figure 14:
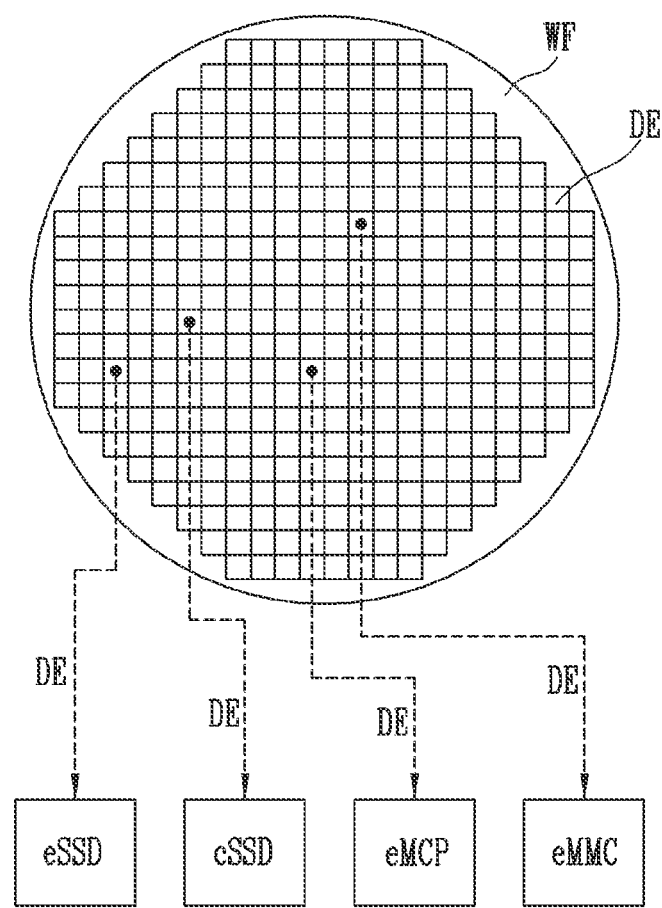

FIGS. 13 and 14 are views illustrating a manufacturing method of a semiconductor package in accordance with a fourth embodiment of the present disclosure.

Referring to FIGS. 13 and 14, on a production line, a plurality of wafers may be simultaneously manufactured in a lot unit. For example, when 25 wafers are included in each of first to third lots 1LOT to 3LOT, 25 wafers WF included in the first lot 1LOT may be simultaneously manufactured, and 25 wafers WF included in the second lot 2LOT may be simultaneously manufactured subsequently to the first lot 1LOT. Wafers WF included in the first to third lots 1LOT to 3LOT may be tested in an order in which the wafers WF are completely manufactured, and scores may be given according to test results. For example, when the first lot 1LOT among the first to third lots 1LOT to 3LOT is completely manufactured, test operations on the 25 wafers WF included in the first lot 1LOT may be performed. Subsequently, total scores of the 25 wafers WF included in the first lot 1LOT may be calculated according to results of the test operations. In this manner, test and score calculation steps of the other second and third lots 2LOT and 3LOT may be performed.

In a classification step, dies DE may be classified according to a total score, regardless of manufacturing order. That is, when total scores of the wafers included in the first to third lots 1LOT to 3LOT are calculated, the dies DE may be classified according to a reference value of each of semiconductor products. For example, dies to which a total score corresponding to the reference value of the eSSD is given among dies DE included in the first to third lots 1LOT to 3LOT may be classified as dies for the eSSD. In this manner, dies among the dies DE included in the first to third lots 1LOT to 3LOT may be classified according to a total score corresponding to the reference value of each of the cSSD, the eMCP, and the eMMC.

Figure 15A:
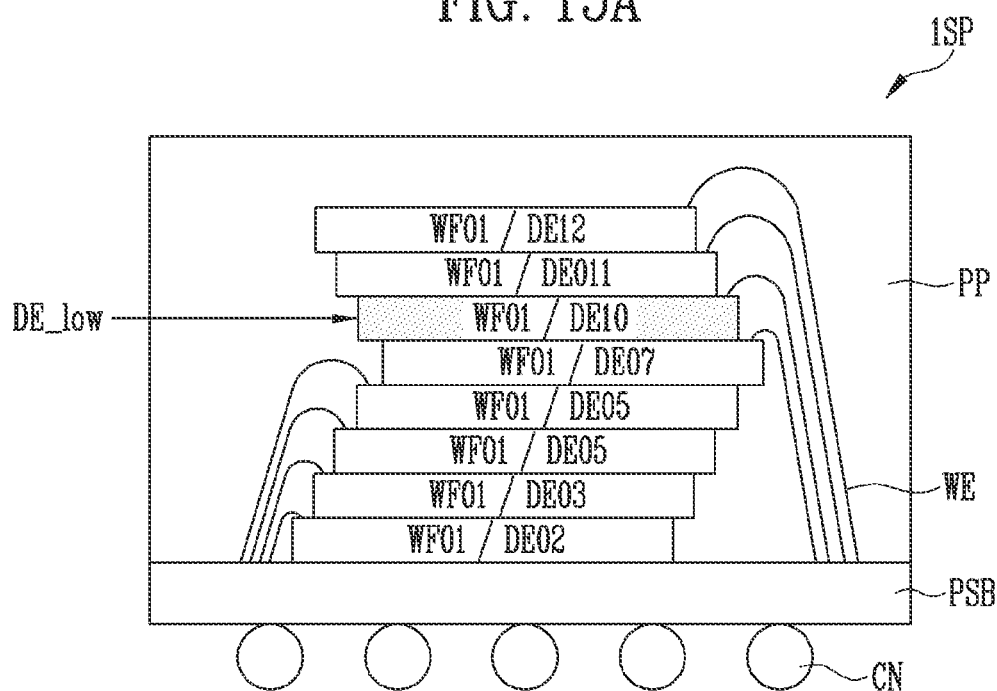
FIGS. 15A and 15B are diagrams illustrating semiconductor packages.
Figure 15B:
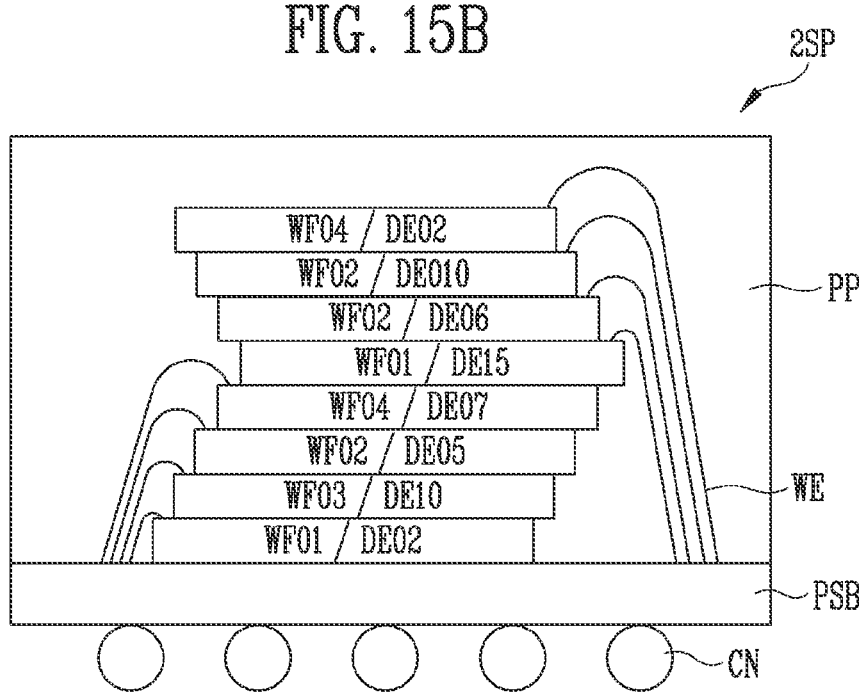

FIGS. 15A and 15B are diagrams illustrating semiconductor packages. FIG. 15A is a diagram illustrating a first semiconductor package 1SP manufactured in accordance with a conventional art, and FIG. 15B is a diagram illustrating a second semiconductor package 2SP manufactured in accordance with this embodiment.

Referring to FIG. 15A, the first semiconductor package 1SP may include a plurality of dies DE stacked on a package substrate PSB, wires WE for connecting the plurality of dies DE to the package substrate PSB, a connect terminal CN for connecting the package substrate PSB to an external device, and a protection layer PP for protecting the plurality of dies DE and the wires WE.

The dies DE included in the first semiconductor package 1SP manufactured in accordance with the conventional art may be packaged in an order in which the dies DE are manufactured. For example, the dies DE included in the first semiconductor package 1SP may be manufactured on a first wafer WF01. Even in the conventional art, the wafer on which the dies DE are manufactured goes through a test step, but only defective dies may be excluded from the package through the test step. Therefore, the first semiconductor package 1SP may be configured with the dies DE having different performances, reliabilities, and durabilities. When the performance of any one die DE_low is relatively low, the first semiconductor package 1SP may be determined as a defective package which is not used for semiconductor products, and therefore, a yield may become low.

Referring to FIG. 15B, dies DE included in the second semiconductor package 2PS manufactured in accordance with this embodiment are selected according to scores, regardless of an order in which the dies DE are manufactured. Hence, the dies DE may have similar performances, reliabilities, and durabilities. For example, the dies DE included in the second semiconductor package 2SP may be selected from first to fourth wafers WF01 to WF04 to be packaged. Dies which are not packaged in the second semiconductor package 2SP may be manufactured as a semiconductor package satisfying another condition, and therefore, a yield may become high.

In accordance with the present disclosure, a manufacturing step of the memory device can be optimized by considering a yield and a quality of the memory device, and a defect rate after packaging can be decreased.

While the present disclosure has been shown and described with reference to certain embodiments thereof, it will be understood by those skilled in the art that various changes in form and detail may be made therein without departing from the spirit and scope of the present disclosure as defined by the appended claims and their equivalents. Therefore, the scope of the present disclosure should not be limited to the above-described embodiments but should be determined by not only the appended claims but also the equivalents thereof.

In the above-described embodiments, all steps may be performed or some steps may be selectively omitted. In each embodiment, the steps are not necessarily performed in accordance with the described order and may be rearranged. The embodiments disclosed in this specification and drawings are only examples to facilitate an understanding of the present disclosure, and the present disclosure is not limited thereto. That is, it should be apparent to those skilled in the art that various modifications can be made on the basis of the technological scope of the present disclosure.

Meanwhile, the embodiments of the present disclosure have been described in the drawings and specification. Although specific terminologies are used here, those are only to explain the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein.

What is claimed is:

1. A method of manufacturing a semiconductor package, the method comprising:
   manufacturing dies on each of wafers;
   testing the wafers including the dies;
   calculating total scores for the wafers according to results of the testing;
   setting reference values corresponding to semiconductor products;
   classifying, as the semiconductor product, a selected wafer having a total score corresponding to a selected reference value among the reference values; and
   packaging the dies included in the selected wafer,
   wherein, in the testing of the wafers, at least one of an operation test, a bad block test, a die health test, a section map test, a fail bit test, a quadrat weighted sum test, and a convolution neural network test is used with respect to each of the dies.

2. The method of claim 1, wherein the dies are separated from each other by scribe lanes on each of the wafers.

3. The method of claim 1, wherein the dies include:
   a memory cell array configured to store data; and
   peripheral circuits configured to perform at least one of a program operation, a read operation, and an erase operation of the memory cell array.

4. The method of claim 1, wherein the testing the wafers includes performing a test operation on the dies included in each of the wafers.

5. The method of claim 1, wherein the calculating the total scores for the wafers according to results of the testing includes:
   calculating scores with respect to each of tests performed on the wafers included in the testing;
   calculating the total scores by adding up the scores calculated for each of the wafers; and forming a score table including the scores and the total scores.

6. The method of claim 5, wherein the score table is used to compare the total scores with the reference values in the classifying of the selected wafer as the semiconductor product.

7. The method of claim 1, wherein the reference values are set according to performance, reliability, and durability, which are required in each of the semiconductor products.

8. The method of claim 1, wherein the reference values are set according to production amounts of the semiconductor products.

9. The method of claim 1, wherein the reference values are set to have different ranges according to the semiconductor products.

10. A method of manufacturing a semiconductor package, the method comprising:
    manufacturing dies on a wafer;
    performing test operations on the dies;
    calculating scores for the dies according to results of the test operations;
    setting a reference range corresponding to a semiconductor product;
    classifying, as the semiconductor product, selected dies having a score included in the reference range; and
    packaging the selected dies,
    wherein the test operations include at least two of an operation test, a bad block test, a die health test, a section map test, a fail bit test, a quadrat weighted sum test, and a convolution neural network test performed on each of the dies.

11. The method of claim 10, wherein the dies are simultaneously manufactured on the wafer.

12. The method of claim 10, wherein the calculating the scores for the dies includes forming a score table including the scores for the dies.

13. The method of claim 10, wherein the reference range is set according to performance, reliability, and durability, which are required in the semiconductor products.

14. The method of claim 10, wherein the reference range is set according to a production amount of the semiconductor product.

15. The method of claim 14, wherein the reference range is increased as the production amount of the semiconductor product increases, and the reference range is decreased as the production amount of the semiconductor product decreases.

16. The method of claim 10, further comprising mounting a semiconductor package in the semiconductor product, when the semiconductor package is manufactured by packaging the selected dies.

* * * * *